United States Patent [19]

Betton et al.

[11] Patent Number: 5,066,905
[45] Date of Patent: Nov. 19, 1991

[54] BATTERY CABLE ASSEMBLY WITH IN-LINE SWITCH

[75] Inventors: Arnold L. Betton, Reseda; Edgar A. Hirzel, Granada Hills, both of Calif.

[73] Assignee: Baton Labs, Inc., Granada Hills, Calif.

[21] Appl. No.: 426,944

[22] Filed: Oct. 24, 1989

Related U.S. Application Data

[63] Continuation-in-part of Ser. No. 271,243, Nov. 14, 1988, abandoned.

[51] Int. Cl.$^5$ .................... G01R 19/145; H01R 13/62
[52] U.S. Cl. ..................... 324/133; 439/289; 439/304; 439/266; 439/784; 200/317
[58] Field of Search ............... 439/502–504, 439/320, 323, 340, 365, 368, 369, 372, 289, 292, 489, 490, 638, 505, 152, 253, 304, 307, 266, 628, 784, 920; 324/538, 133; 340/654, 644, 652; 200/316, 567, 564, 310, 313, 317

[56] References Cited

U.S. PATENT DOCUMENTS

| | | |
|---|---|---|
| 1,390,607 | 9/1921 | Farmer . |
| 2,196,501 | 4/1940 | Kehm ............................ 340/644 |
| 3,644,871 | 2/1972 | Lafont . |
| 3,994,552 | 11/1976 | Selvin ........................ 439/289 X |
| 4,042,759 | 8/1977 | Cella . |
| 4,060,299 | 11/1977 | Williams . |
| 4,163,599 | 8/1979 | Plugge et al. .................. 439/320 X |
| 4,721,475 | 1/1988 | Burke, Jr. ...................... 439/304 X |
| 4,721,479 | 1/1988 | Shuman ........................... 439/505 |

Primary Examiner—Jack B. Harvey
Attorney, Agent, or Firm—Willian Brinks Olds Hofer Gilson & Lione

[57] ABSTRACT

A battery cable assembly having an in-line captive switch device, in which the battery cable conductor is divided into two parts, with a conductive contact pad electrically attached to the end of each part, the pads being axially aligned within the bore of a housing having a threaded sleeve member formed, at least partially, of insulating material. The first pad is secured within the sleeve in fixed non-rotating relation thereto, and in fixed position relative to the first cable portion. The second cable portion is provided with a threaded ferrule which is rotatable relative to the second cable portion for providing relative axial displacement between the pads. The rotatable ferrule is captively rotatable to preclude separation of the two cable portions. A blinking light-emitting device is electrically coupled to the two cable portions for energization via the storage battery and electrical circuit through the light-emitting device to provide visual indication when the pads separate.

24 Claims, 4 Drawing Sheets

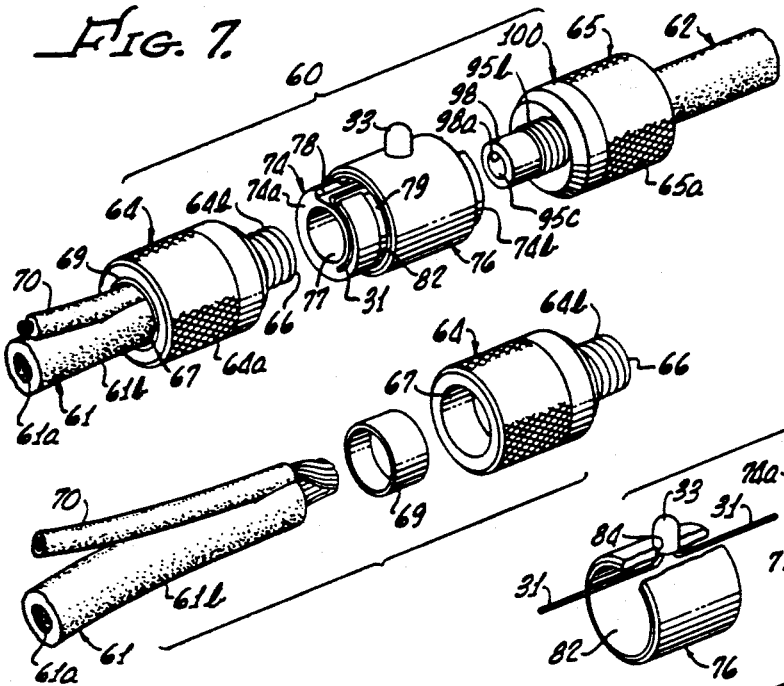
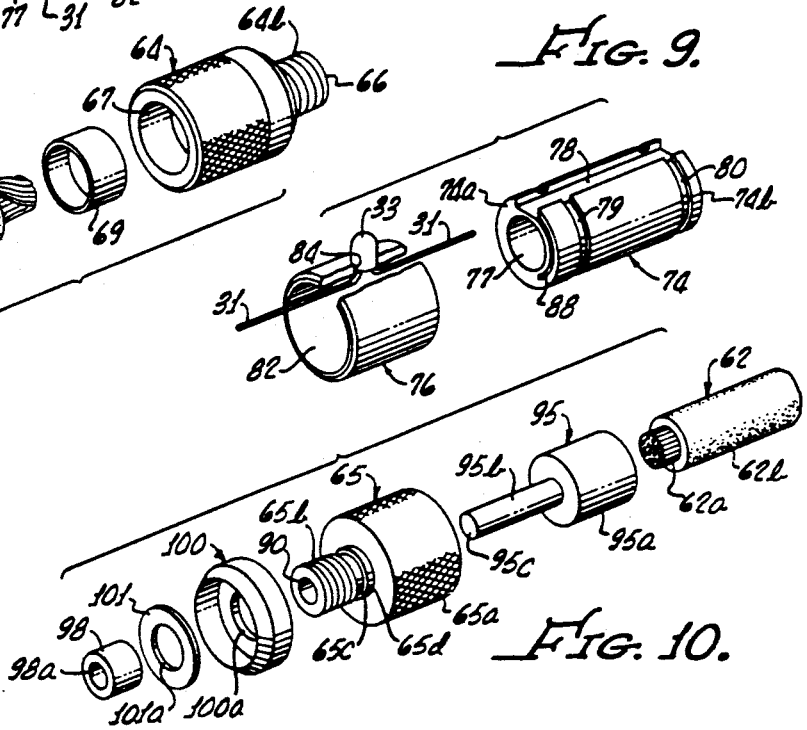
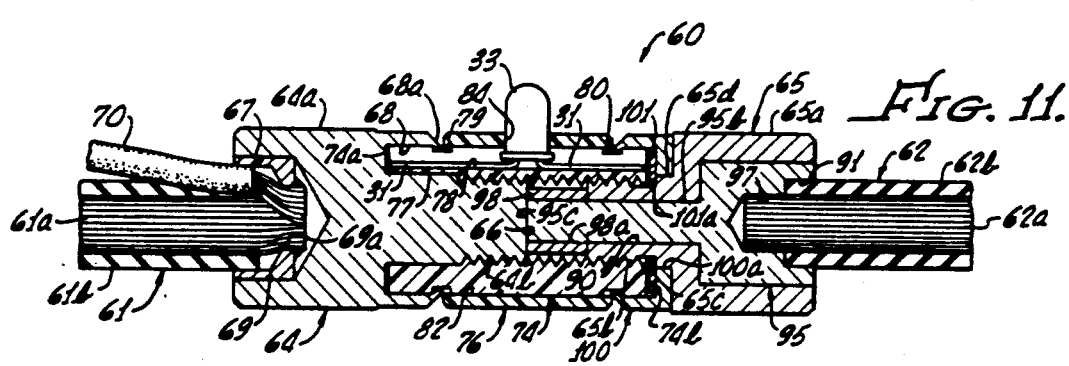
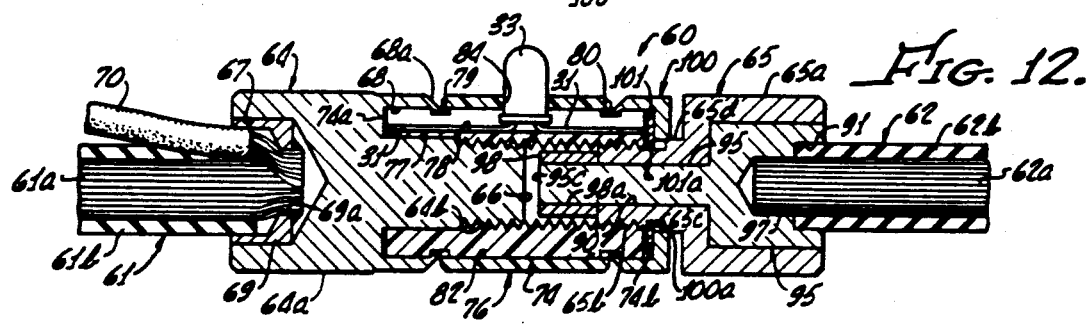

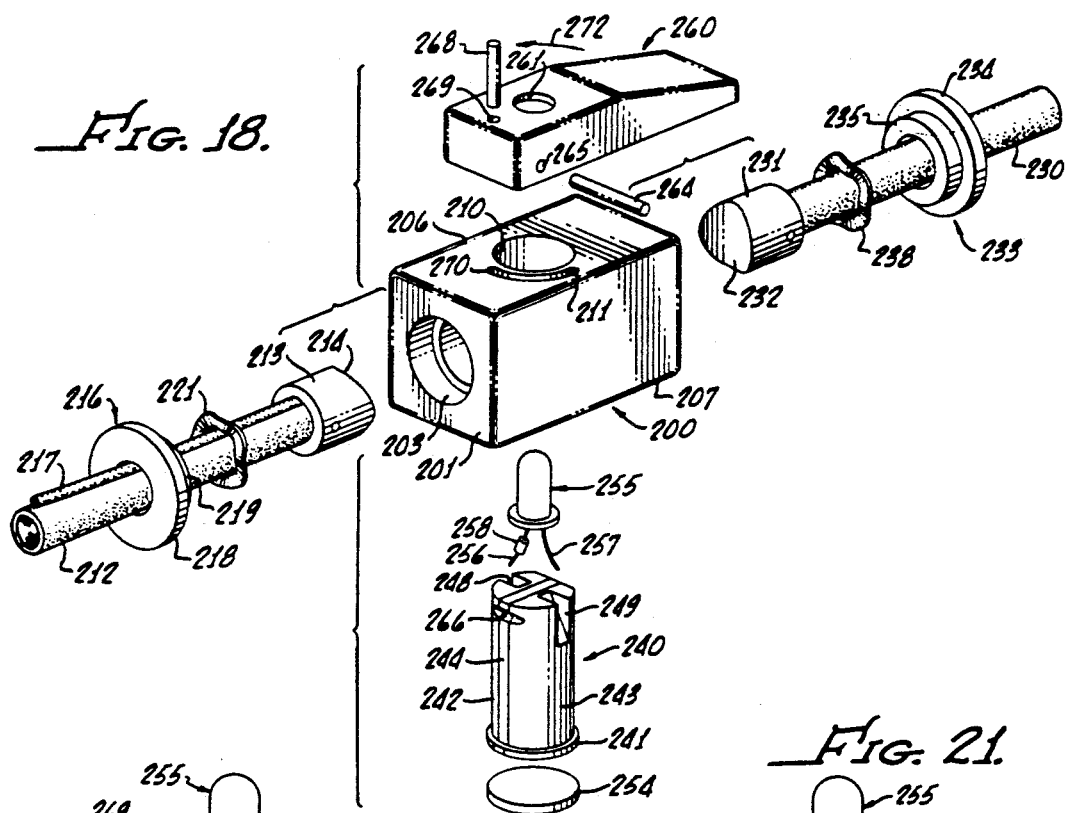
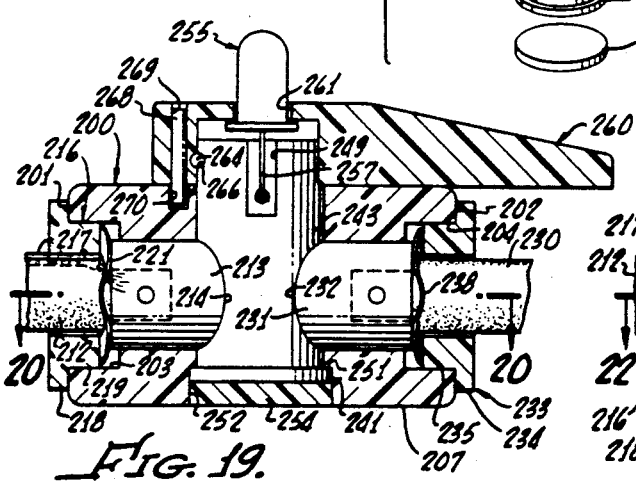
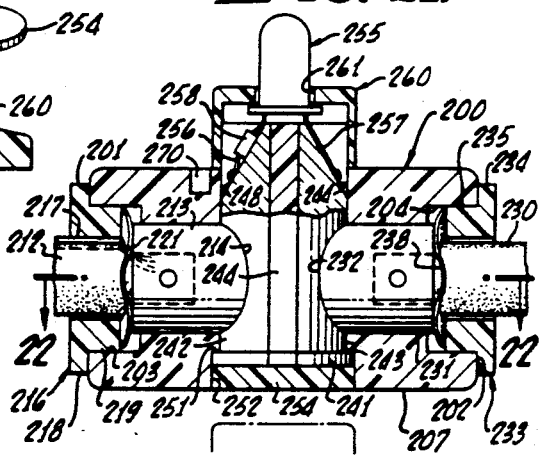
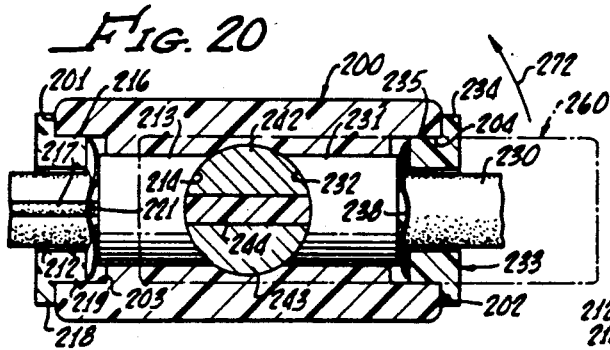
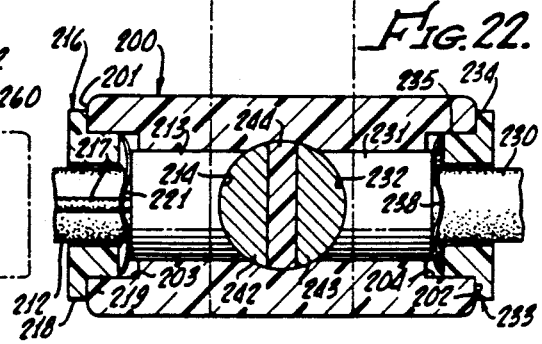

BATTERY CABLE ASSEMBLY WITH IN-LINE SWITCH

This application is a continuation-in-part of application Ser. No. 271,243, filed Nov. 14, 1988, now abandoned for Battery Cable Assembly with In-Line Switch. The disclosure of the prior application is incorporated herein by this reference as though fully set forth.

BACKGROUND OF THE INVENTION

The background of the invention will be discussed in two parts.

Field of the Invention

This invention relates to switching devices, and more particularly to a captive switching device in line with a storage battery cable.

Description of the Prior Art

Storage batteries have widespread application, particularly, lead-acid storage batteries which are commonplace in vehicles, such as cars, trucks, boats, and the like. Storage batteries are used to power the wide variety of electrical equipment, and, in vehicles, such batteries are the only source of power for the starter motor. When the vehicle is being repaired, if there is any chance of accidental contact with any electrical lead lines, it is common practice to disconnect the battery. Usually, and preferably, this disconnection is at the ground terminal, whether the system is a positive or a negative ground. With automobiles, as an example, the ground connection is accomplished by a battery cable connected between the battery terminal and the vehicle chassis.

Removal of the ground connection is virtually mandated when the repairs undertaken are electrical repairs to the vehicle. Lead-acid storage batteries are susceptible to explosion, and care must be exercised to avoid placing undue shock on the battery, particularly electrical shock which can result from accidental grounding of the hot terminal of the battery with the ground terminal connected to the chassis. Exploding storage batteries may expel liquid acid and shrapnel, with the potential of causing acid burns and puncture wounds.

A conventional storage battery cable includes a heavy conductor, usually a multiple strand braided wire conductor, within an insulated sleeve, with one end having a strap connector for attachment to a ground point, such as the chassis or engine block. For batteries with anode and cathode post connections, the other end of the cable is provided with a soft conductive metal split clamp member with a tapered opening for positioning on the post. A suitable nut and bolt clamp tightening arrangement is provided for fastening the clam securely to the battery post. For side terminal batteries, the battery connecting end of the cable is provided with an enlarged flange with a central opening through which is passed a fastening member, such as a bolt member.

With post type terminals, there is a tendency of many mechanics, both professional and amateur, to ignore disconnection of the battery prior to attempting to effect repairs. This is due, in part, to laziness and, in part, to difficulty in loosening the clamp bolt member, and removing the clamp. The same is true of side terminal batteries, in which the bolt head is very often inaccessible and of a small size. In some instances, corrosion at the battery terminal connections precludes ready removal of the cable. In any event, such a disconnection usually takes more time than one would like, and therefore, the cable is removed infrequently.

Such removal problems are virtually eliminated by the instant invention. In accordance with an aspect of the invention, it is accordingly an object of the invention to provide a storage battery cable with a manually operable twist type switch.

SUMMARY OF THE INVENTION

The foregoing and other objects of the invention are accomplished by providing a storage battery cable assembly having an in-line captive switch device, in which the battery cable conductor is divided into first and second parts, with first and second conductive contact pads or members electrically attached to the thus exposed ends. The contact pad members are axially aligned within the bore of a housing in the form of a threaded sleeve member formed, at least partially, of insulating material. The first contact member is secured within the sleeve in fixed non-rotating relation thereto, and in fixed position relative to the first cable portion. The second cable portion is provided with a rotatable ferrule through which the cable portion is inserted prior to affixation of the second contact pad member. The ferrule is thus rotatable relative to the second cable portion. The ferrule includes a threaded cylindrical stem portion, which coactingly engages the threaded sleeve. Captive retention means are provided to preclude mechanical separation of the rotatable ferrule while permitting selective electrical disconnection. In one embodiment, the facing surfaces of the sleeve and ferrule are each provided with an axially extending pin member, the two pin members then coacting to limit the degree of rotation of the ferrule relative to the sleeve. This rotation is limited to less than one complete turn, with the length of the stem portion being sufficient to preclude separation during this turn. In another embodiment, the stem portion is necked down for receiving a washer member which holds the ferrule captive. A light-emitting device has opposite leads thereof in electrical circuit relation with the two battery cable portions. A conductive path between opposite ends of the cable is effected by tightening the ferrule to place the two conductive contact pads in contacting relation within the sleeve, at which time, the light-emitting device is shunted, and therefore, not illuminated. To disconnect, the ferrule is unthreaded relative to the sleeve to separate the contact pads inside the sleeve, at which time, a circuit is completed through the light-emitting device to provide visual indication that the battery ground connection has been broken. The light-emitting device preferably blinks when the circuit there through is completed.

In another embodiment, the cables and end caps are secured to first and second nonconductive ferrules, with one of the end caps being rotatable relative to its securing ferrule. The two connectors are threadedly engaged and tightened against each other by relative rotation to axially drive the contacting faces of the end caps against each other for good, firm electrical contact. After the connectors are secured to one another, a pin is inserted into one of the connectors to extend therefrom into a slot extending around part of the circumference of the other connector so as to limit relative rotation of the two connectors to less than 360°. This allows relative rotation of the connectors to electrically disconnect the end caps, but allows only slight relative displacement of the two connectors so that these and the cables to which they are affixed remain firmly and securely mechanically interconnected at all times. As in the other embodiments a light-emitting device is connected to the separable cables, deenergized when the cables are electrically connected, and energized when the cables are electrically disconnected.

Other objects, features and advantages of the invention will become readily apparent from a reading of the specification, when taken in conjunction with the drawings, in which like reference numerals refer to like elements in the several views.

BRIEF DESCRIPTION OF THE DRAWINGS

FIG. 7 is an exploded perspective view of a modified form of a battery cable assembly disassembled to depict the components thereof;

FIG. 8 is an exploded perspective view showing the components of one portion of the switch device of the battery cable assembly of FIG. 7;

FIG. 9 is an exploded perspective view showing the components of the center portion of the switch device of the battery cable assembly of FIG. 7;

FIG. 10 is an exploded perspective view showing the components of another portion of the switch device of the battery cable assembly of FIG. 7;

FIG. 11 is a longitudinal cross-sectional view of the switch device of the battery cable of FIG. 7 in its assembled condition as viewed generally along the center line thereof, depicting the switch device in its closed position;

FIG. 12 is a cross-sectional view of the switch device, similar to FIG. 11, illustrating the switch in its open or electrically disconnected position;

FIG. 18 is an exploded pictorial view of a further embodiment of a battery cable switch;

FIG. 19 is a longitudinal section through the switch showing the rotary contact member in switch closed position;

FIG. 20 is a section taken on lines 20—20 of FIG. 19;

FIG. 21 is a longitudinal section through the switch showing the rotary contact member in switch open position; and FIG. 22 is a section taken on lines 22—22 of FIG. 21.

DETAILED DESCRIPTION OF THE PREFERRED EMBODIMENT

Figure 1:
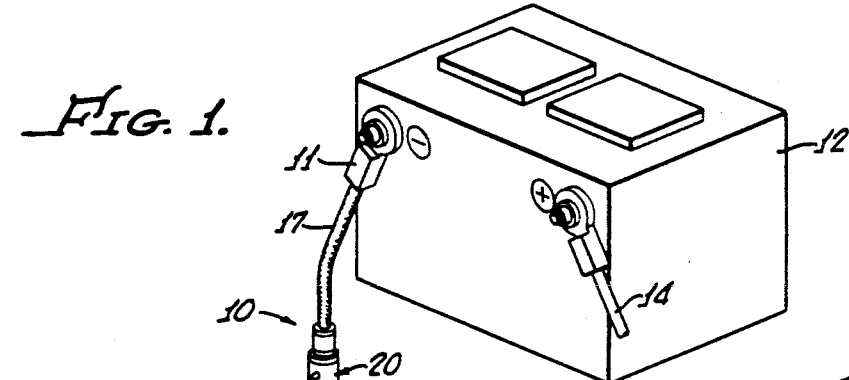
FIG. 1 is a perspective view of a storage battery coupled to a battery cable assembly according to the invention.
Figure 2:
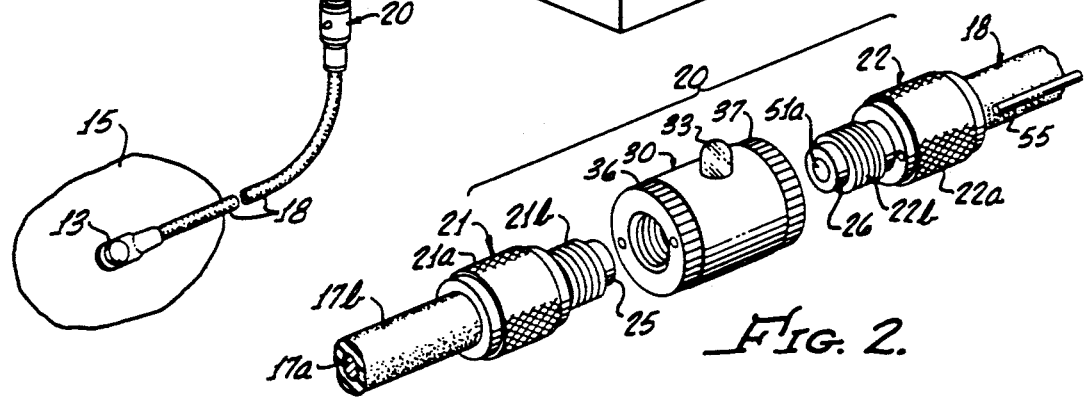
FIG. 2 is a exploded perspective view of the battery cable assembly of FIG. 1 disassembled to depict the components thereof.

Referring now to the drawings, and particularly to FIGS. 1 and 2, there is shown an embodiment of a battery cable assembly, generally designated 10, in accordance with the invention, connected to a lead-acid storage battery 12. The storage battery 12 is of the type referred to as a "side terminal" battery, in which the anode and cathode connections are placed on one side of the battery. In conventional internal combustion vehicle arrangements, with a negative ground system, a first battery cable is connected from the negative terminal of the battery to an appropriate ground on the vehicle, such as the engine block or the chassis. A second battery cable is connected between the positive terminal of the battery and a terminal for the vehicle starting system, which terminal also provides power, directly or indirectly, to other vehicle accessories.

As shown in FIG. 1, the battery 12 has the positive and negative terminals thereof designated with a "+" or "−", with a second conventional battery cable 14 connected to the positive terminal for connection to the starting system and vehicle accessory power terminal. In accordance with the present invention, the ground battery cable is replaced with the cable assembly 10, which has one end 11 connected to the negative terminal and the other end 13 connected to an appropriate ground, such as a portion 15 of the chassis. Intermediate the two ends 11 and 13 there is an in-line switch device, generally designated 20.

Referring now to FIG. 2, the switch device 20 will be briefly described. FIG. 2 shows the parts of switch device 20 in the exploded disassembled position, although, as will be hereafter described, the parts are held in captive relation, that is, the parts of switch device 20, in use, are not mechanically detachable from each other. As shown, the battery cable is divided into two parts 17 and 18 between opposite connector ends 11 and 13. Each cable portion 17,18 includes a conductive member 17a, 18a and a surrounding insulating sleeve 17b, 18b. First and second metal ferrules 21 and 22 are provided, each ferrule being generally identical with an axial opening extending there through. Each ferrule is provided with a knurled hand gripping portion 21a, 22a and a reduced diameter threaded stem portion 21b, 22b. The cable portion 17 is fed through the opening of the ferrule 21 and the second cable portion 18 is fed through the second ferrule 22. Electrically conductive contact pads 25,26 are suitably attached to the exposed conductive ends of the battery cable conductor 17a, 18a, respectively. The switch device 20 includes a main housing portion, generally designated 30, which is in the form of a cylindrical sleeve, at least part of which is insulated, and part of which is conductive. The housing 30 has an axial bore there through, which is threaded at each end for receiving the threaded stem portions 21b, 22b of the ferrules 21,22, respectively.

FIG. 1 depicts the switch device 20 in its assembled condition. Mounted within the housing 30, there is a visual condition indication means, in the form of a low current light-emitting diode 33, which protrudes through an opening in the housing 30, and which, as will be described hereinafter, blinks when the switch device 20 is actuated to its "open" position, that is, in essence, disconnecting the negative or ground from the vehicle power system.

Figure 3:
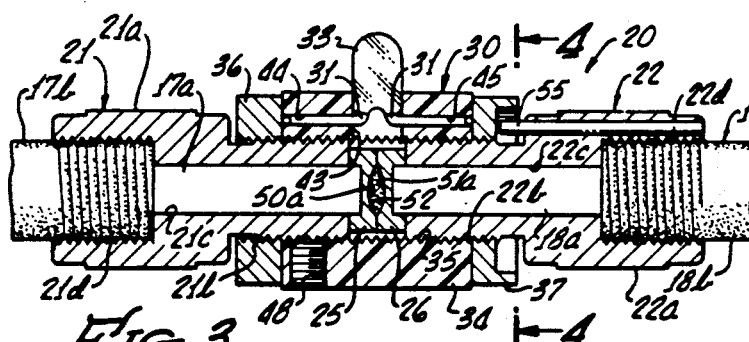
FIG. 3 is a longitudinal cross-sectional view of the switch device of the battery cable of FIG. 1, depicting the switch device in its closed position.
Figure 5:
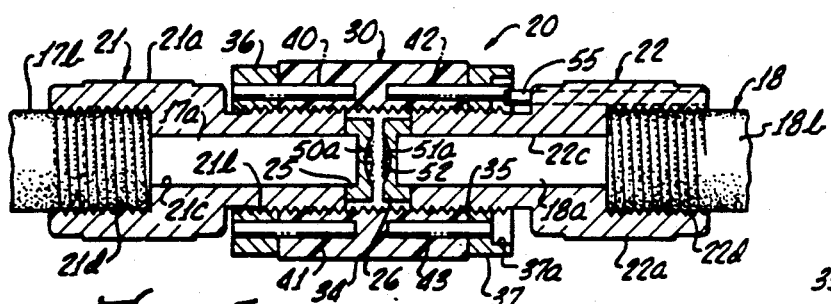
FIG. 5 is a partially cross-sectional view of the switch device, similar to FIG. 3, illustrating the switch in its open or electrically disconnected position.

Referring now to FIG. 3, the internal construction of the switch device 20 will be discussed in detail. As shown, the housing 30 includes a main tubular sleeve member 34 with a threaded bore 35. The sleeve member 34 is formed of a suitable insulating material, such as nylon or the like. First and second conductive metallic end caps 36 and 37 are securely attached to opposite ends of the sleeve member 34 with each of the end caps 36,37 having a threaded opening there through of the same diameter as the diameter of the bore 35. By reference to FIG. 5, the end caps 36,37 may be attached to the sleeve member 34, such as by pinning, that is, for example, inserting pins 40 and 41 axially through the end cap 36 into a press fit frictional engagement with aligned holes in the sleeve member 34. Similarly, pins 42 and 43 secure the end cap 37 to the sleeve member 34, with one exception, the purpose of which will be described hereafter. As shown in FIGS. 3 and 5, the end cap 37 is provided with a shoulder or recess 37a about the central opening. The exception to the pinning arrangement is that the pin 42 extends out axially from the shoulder 37a of cap 37.

For attachment of the light-emitting diode 33 to the housing 30, a first aperture 43 is provided, the aperture 43 extending diametrically through the wall thickness of the sleeve member 34 with the aperture 43 being of a diameter slightly greater than the diameter of the diode 33. First and second aligned axially extending apertures 44 and 45 are formed, such as by drilling through the axial length of the wall of the sleeve member 34 in intersecting relation with the hole 43. The apertures 44 and 45 are adapted for passage there through of the electrical leads 31,32 of the diode 33. These leads 31,32 are of a length sufficient to pass through the respective apertures 44,45, and into engagement with the conductive end caps 36,37, respectively. In practice, the end caps 36,37 may be formed of brass or the like, and the electrical leads 31,32, may be suitably electrically connected, such as by soldering. The housing 30 for the switch device 20 is thus formed as a partially electrically insulating member, with electrically conductive portions 36,37 for connection to electrical leads 31,32 of a light-emitting diode 33.

The electrical path for the battery cable assembly 10 will now be described. The first cable portion, as shown in FIG. 3, includes the conductor 17a and the insulation 17b. The conductor 17a is a multiple strand twisted or braided conductor, of a diameter sufficient for carrying the large current surges normally encountered in vehicles. For assembly, the insulation 17b is stripped back a certain distance from the end of the conductor 17a. The ferrule 21 has an axial opening, formed in two parts. The first part 21c extends through the threaded stem portion 21b of ferrule 21, and is of a diameter slightly greater than the diameter of the conductor 17a. The second part 22d is of a larger diameter within the hand gripping portion 21a of the ferrule 21, and is of a diameter slightly greater than the diameter of the insulation 17b.

During manufacture and assembly, the exposed conductor portion of conductor 17a is passed through the opening 21c, with the insulation 17b being received within the opening 21d. The exposed portion of the conductor 17a is of a length sufficient to pass through the opening 21c entirely with a slight projection there beyond. The projecting end of conductor 17a is then electrically attached, such as by soldering, to a first conductive contact pad 25, which is generally disc-shaped, and of a diameter somewhat smaller than the internal diameter of the threaded bore through end cap 36 and sleeve member 34. With this arrangement, the exposed conductor 17a passing through the opening 21c is in electrical contact with the metallic ferrule 21.

The ferrule 21 is then threaded into the end cap 36 and into the threaded bore 35 of the sleeve member 34 until the face of the conductive contact pad 25 is positioned at the approximate midpoint of the axial length of the bore 35. The ferrule 21 is then fixed in position relative to the housing 30. By way of example, in the embodiment shown, a set screw 48 threadably engages aligned diametrically extending apertures through the sleeve member 34 and the stem portion 21b of the ferrule 21. Other suitable methods may be employed.

Similarly, the exposed portion of conductor 18a is passed through the opening 22c of ferrule 22, with the insulation 18b being received partially within the opening 22d. The exposed portion of the conductor 18a is of a length sufficient to pass through the opening 21c entirely with a slight projection there beyond, with a portion within the opening 22d. The projecting end of conductor 18a is then electrically attached, such as by soldering, to a second conductive contact pad 26, which is generally disc-shaped, and of a diameter somewhat smaller than the internal diameter of the threaded bore through end cap 37 and sleeve member 34. With this arrangement, the exposed conductor 18a passing through the opening 22c is in electrical contact with the metallic ferrule 22.

The distal end of the insulation 18b is spaced slightly from the bottom of opening 22d. In construction, the ferrule 22 is permitted to rotate relative to the cable portion 18, with a limited amount of axial movement of the second conductive contact pad being permitted by this interconnection. That is, the frictional engagement between the outer cover insulation 18b and the ferrule 22 is small to permit this relative rotation.

The stem portion 22a of ferrule 22 is then threaded into the end cap 37 and into the threaded bore 35 of the sleeve member 34 until the face of the conductive contact pad 26 is positioned in proximate relation to the first contact pad 25. As configured, the second contact pad 26 is axially displaceable within the bore 35 relative to the fixed first contact pad 25. This occurs as the ferrule 22 is unthreaded or threaded.

As depicted in FIG. 3, the facing abutting surfaces of contact pads 25 and 26 are provided with central concave portions 50a, 51a. This, in effect, creates a void. A non-corrosive lubricating gel 52 is placed within the bore 35, with a portion of this gel filling the void as the contact pads 25,26 are urged into contacting relation. This gel 52 protects against contact corrosion and poor contact resistance, thus prolonging the life of the battery cable assembly 10. The diameters of the concave portions 50a, 51a are generally identical and of such size that the contacting surface of the pads 25,26 are in excess of sixty percent of the total area, thus providing sufficient contact surface to permit passage of current of the same amount as the cable conductor with virtually no contact resistance introduced into the assembly 10.

The ferrule 22 is maintained captive relative to the housing 30 in the following manner. By reference also to FIG. 5, as previously discussed, the pin 42 which secures end cap 37 to sleeve member 34, protrudes axially outwardly from the shoulder 37a toward the ferrule 22. A corresponding pin 55 passes axially through an opening adjacent the periphery of ferrule 22. With ferrule 22 threadably engaging the end cap 37, the pin 55 extends toward the shoulder 37a and pin 55, when rotated along with ferrule 22, defines an arc of a given radius, which radius corresponds to the radial displacement of the pin 42 relative to the axis of the bore 35 of sleeve member 34.

Figure 4:
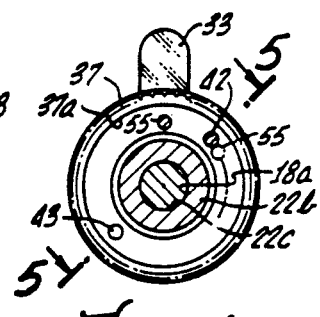
FIG. 4 is a cross-sectional view of the switch device of FIG. 3 taken generally along line 4—4 thereof.

Thus, as shown in FIG. 4, the moving pin 55 of ferrule 22 moves along the same circumference as the location of the fixed pin 42, thereby limiting the degree of rotation of the ferrule 20, as a consequence of these pivot stop means. During fabrication, the pin 55 is partially inserted into the aperture of ferrule 22 from the right side of the ferrule as viewed in FIG. 3. The stem portion 22b of ferrule 22 is then threaded into the coacting aligned threads of end caps 37 and bore 35 until the contact pad 26 tightly engages pad 25. The pin 55 is positioned along the circumference of the ferrule 22 at a location such as shown in solid lines, in FIG. 4, that is at an angle to the left (or counterclockwise) of the fixed pin 42. The pin 55 is then inserted the rest of the way, until pins 55 and 42 are in the positions shown in FIG. 4, that is, adjacent relation on the same path. Thereafter, the ferrule 22 may be unthreaded through an angle defined by the limits permitted by the pin 42. As shown in FIG. 4, the pin 55, when rotated counterclockwise to the other extreme limit shown in dotted lines, contacts the fixed pin 42, thus preventing further rotation. The angle of rotation of the ferrule 22 is thus limited to a turn of about 300 degrees, that is, less than a full turn.

The pitch of the thread of the bore 35 (and end cap 37), combined with the length of the stem portion 22b of ferrule 22, provides an axial separation of contact pad 26 relative to contact pad 25 (when pin 55 contacts fixed pin 42) of about three thirty-seconds of an inch, with the stem portion 22b still threadably engaging the bore 35 for a major part of its length, that is, the ferrule 22 is mechanically held firmly captive and does not separate from the housing 30. In this manner, with electrical disconnection of the switch device 20, the battery cable assembly is not physically disconnected from the battery to provide an additional margin of safety since the cable 10 is still attached to the battery and thus held in place.

FIG. 3 depicts the switch device 20, in the closed position with the two contact pads 25,26 in electrically connected abutting relation and, in this position, the pins 42 and 55 are in the position shown in solid lines in FIG. 4, that is, with pin 55 about 60 degrees to the left of pin 42. When the switch device 20 is in the partially open position, the contact pads 25,26 are separated about half the total distance of separation, with the pin 55 being angularly spaced about 100 degrees counterclockwise from the fixed or stationary pin 42. With full separation between the pads 25,26, the ferrule pin 55 is in the broken line position in FIG. 4, that is, in abutting relation with the pin 42 on the opposite side thereof.

Figure 6:
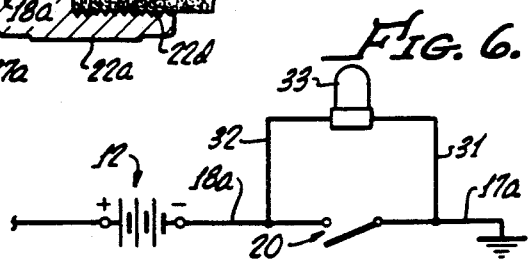
FIG. 6 is a schematic drawing depicting the equivalent s circuit of the switch and indicator of the battery cable assembly of FIG. 1.

When the switch device 20 is in the "open" position as depicted in FIG. 5, that is with the pads 25,26 separated, the equivalent electrical circuit is as shown in FIG. 6. The reference numerals in FIG. 6 correspond to the parts heretofore described. The cable conductor portion 18a is connected to the ground or negative terminal of the battery 12, and, with the switch device 20 opened, the circuit is completed from ground through conductor portion 17a through lead 31, through light-emitting diode 33 through lead 32, through conductor 18a, and through battery 12. In this instance, the light-emitting diode 33 is illuminated and blinks so long as the switch device 20 is open. With switch device 20 closed, that is, with the contact pads 25,26 in the position shown in FIG. 3, the diode 33 is shunted and therefore not energized.

In use, the cable assembly 10 is connected to the ground terminal of the battery 12, as shown in FIG. 1, in the same manner as connection of a conventional battery cable. As connected, with the switch device 20 closed, the cable assembly 10 acts in the same manner as a conventional cable. To disconnect or break the circuit, the mechanic grasps both of the ferrules 21,22 and rotates the ferrule 22 counterclockwise through less than a full turn until the pin 55 contacts the pin 42. This pin contact prevents further relative rotation and prevents mechanical separation of the two cable sections 17,18. As the contact pads 25,26 separate, the diode 33 will commence blinking. The mechanic may then commence work on the electrical system of the vehicle. In effect, the switch device 20 is an axially operable switch actuated by rotary motion via the threaded coaction to provide the switch pad 25,26 displacement, while preventing mechanical separation.

FIGS. 7 through 12 depict a modified embodiment of the cable assembly of FIG. 1. While there are some structural differences, the cable assembly, generally designated 60, functions in the same manner as the cable assembly 10 of FIG. 2. By reference to FIG. 7, the cable assembly includes first and second battery cable portions 61,62, with each cable portion 61,62 including a conductive member 61a, 62a and a surrounding insulating sleeve 61b, 62b. First and second metal ferrules 64 and 65 are provided, each ferrule having a generally identical outer diameter with an axial opening extending there through. Each ferrule is provided with a knurled hand gripping portion 64a, 65a and a reduced diameter threaded stem portion 64b, 65b. The cable portion 61 is fed through the opening of the ferrule 64 and the second cable portion 18 is fed through the second ferrule 65.

As will be described, two electrically conductive contact pads are suitably attached to the exposed conductive ends of the battery cable conductor 61a, 62a, respectively. However, one pad is formed as part of the ferrule 64. Referring to FIG. 8, the ferrule 64 has an enlarged diameter body portion 64a, which is knurled for hand gripping, and a reduced diameter projecting finger portion including a threaded stem portion 64b at the end thereof, with an unthreaded portion. The distal end of the threaded stem portion 64b of ferrule 64 is generally planar to form a first contact pad 66. The end may also have a concavity as shown in the previous embodiment.

An axially extending centrally disposed recess 67 is formed in the rear of portion 64a. The front of portion 64a is provided with an annular recess 68 (see FIG. 11) of a diameter slightly greater than the diameter of stem portion 64b. The outer edge 68a of the recess 68 is tapered. The purpose of the recess 68 and the tapered edge 68a will be described hereinafter.

For attachment of the cable portion 61, the following takes place. The cable portion 61 has the insulation 61b removed for a short distance from the end to expose the conductor 61a. An auxiliary cable 70 is likewise stripped of insulation to expose the conductor, with the two thus-exposed conductor portions being wetted with solder. A cup-shaped metallic, electrically conductive attachment member 69 is provided with a central aperture 69a into which is inserted the soldered ends of the two conductors, with solder then being applied to join the member 69 to the joined conductors. The cup-shaped member 69 has an outer diameter almost equal to the inner diameter of the recess 67 of the ferrule 64. The parts are then joined by application of pressure, that is, member 69 (with the attached conductors) is forcibly inserted into the recess 67.

Referring now to FIGS. 9 and 11, the switch device 60 includes a main housing, formed of first and second parts, and includes an inner sleeve member, generally designated 74, and an outer sleeve member, generally designated 76. The inner s sleeve member 74 is formed of an insulative or plastic material, such as nylon, and includes an axially threaded bore 77. In practice, a single thread will not traverse the entire bore 77, but will be a right hand thread extending from each end to the approximate midpoint of bore 77. An axially extending groove 78 is formed in the outer surface of member 74. In addition, circumferential recesses, or grooves, 79 and 80 are formed in the outer surface adjacent ends 74a and 74b of member 74, with groove 79 spaced from end 74a a distance greater than the spacing between groove 80 and end 74b.

The outer sleeve member 76 is likewise formed of nylon and has an axial length less than the axial length of the member 74. Sleeve member 76 has an outer diameter approximating the outer diameter of the knurled portions 64a and 65a of ferrules 64 and 65, with the outer surfaces of the member 76 adjacent the edges thereof being tapered. Member 76 has an axial bore 82 of a diameter slightly less than the outer diameter of the sleeve member 74 for enabling receipt of the member 74 within the bore 82.

As shown in FIG. 11, the axial length of member 76 approximates the distance between the grooves 79 and 80 of member 74. The member 76 is provided with a radially extending centrally disposed aperture 84 (see FIG. 11) of a diameter slightly greater than the diameter of the light-emitting diode 33 to be inserted therein. As partially assembled, the light-emitting diode has the leads 31 thereof passed into the aperture 84, whereupon the leads are bent axially in opposite directions in proximate relation to the adjacent inner surface of bore 82 of outer sleeve member 76. The axial groove 80 of inner sleeve member 74 is then aligned with the leads 31 and member 74 is inserted into member 76 with the leads 31 fitting within groove 80. The leads 31 are of a length sufficient to extend beyond the ends of inner sleeve 74. For electrical coupling purposes, the annular faces of the ends 74a and 74b are at least partially circumferentially slotted or grooved, such as at groove 88 in the end 74a of member 74 in FIG. 9, for enabling placement therein of the terminal ends of the leads 31. The depth of the groove 88 is slightly less than the width of the lead 31 for enabling part of the lead 31 to project above the end face surfaces of ends 74a and 74b. The assembled diode 33 and housing parts 74,76 are as shown in FIG. 7, with the terminal end of one lead 71 fitted within the groove 88.

Referring now to FIGS. 7, 10 and 11, the other electrical contact for the switch device 60 is configured as follows. The ferrule 65 is provided with an axially extending central bore 90 through the stem portion 65b, with a larger diameter coaxial bore 91 (see FIG. 11) formed in portion 65a. The two bores 90,91 are configured and dimensioned for receiving a metallic, electrically conductive pin connector member, generally designated 95, which has a main body portion 95a with a diameter slightly less than the inner diameter of bore 91 and a solid pin portion 95b of an outer diameter slightly less than the inner diameter of bore 90.

As shown in FIG. 11, the pin member 95 is provided with a stepped cup-shaped recess 97, with the two stepped diameters being sufficient for enabling receipt of the end of cable portion 62 therein, that is, the innermost stepped cup is of a diameter sufficient to receive the conductor portion 62a, with the outer step sufficient to receive the insulation cover 62b of the conductor 62. The pin member 95 and the cable portion 62 are electrically joined in any suitable manner, such as by soldering.

The pin member 95 is then coupled to the ferrule 65 by insertion of the pin member 95 into the recess 97, with the pin portion 95b of the pin 95 having a length sufficient to project through bore 90 and beyond the end of stem portion 65b of ferrule rule 65. The tolerance between the parts is such that the ferrule 65 is manually rotatable relative to the inserted pin member 95. The length of the projection of pin portion 95 is sufficient for enabling attachment of an annular member 98, which, as will be described, acts in conjunction with the end surface 95c of pin portion 95b, to serve as the second conductive pad for the switch device 60. The annular member 98 has an outer diameter approximating the outer diameter of the end surface 66 of stem portion 64b of ferrule 64, and an inner aperture 98a of a diameter closely approximating that of the diameter of the distal end of pin portion 95b of pin member 95. The relative diameters are such that an interference fit is provided, that is, the annular member 98 is press fit onto the end of pin portion 95b until the outer face of annular member 98 is flush with, or slightly outwardly of the end face 95c of pin portion 95b. Upon force fitting the member 98 to the end of pin portion 95c, there is a slight axial spacing or distance between the inner abutting surfaces of the annular member 98 and the adjacent edge of stem portion 65b of ferrule 65 which enable relative rotation between ferrule 65 and pin member 95, for reasons which will become apparent.

The subassembly of ferrule 65 and pin member 95 is then processed further. As shown in FIGS. 10 through 12, at the part of ferrule 65 intermediate portions 65a and 65b, there is a smooth cylindrical shoulder portion 65d and a reduced diameter or necked down portion 65c, the diameter being slightly less than the outer diameter of the threaded stem portion 65b. A cup-shaped swivel attachment member, generally designated 100, is provided in the base of the cup thereof with a central aperture 100a of a diameter sufficient for insertion there through of the stem portion 65b of ferrule 65 until the aperture 100a engages the shoulder portion 65d. The aperture 100a is slightly greater than the outer diameter of shoulder portion 65d so that the member 100 is rotatable relative thereto. The brim or edge of the cup-shaped member 100 is tapered to a configuration the same as the tapered edge of the ferrule 64 about the annular recess 68.

A washer member 101 is dimensioned for being loosely received within the cup of the member 100 with the diameter of the central aperture 101a of washer member 101 being very slightly less than the outer diameter of the threaded portion of the stem portion 65b of ferrule 65. After placing the cup-shaped member 100 on the shoulder portion 65d with the cup opening facing outwardly, the washer member 101 is then positioned within the necked down portion 65c. To accomplish this, the washer member 100 is of a thickness equal to or less than the spacing between adjacent threads of the stem portion 65b, with the diameter of aperture 101a of washer member 100 being at about the mean diameter of the stem portion 65b, that is, the diameter of aperture 101a relative to the threaded portion 65b lies midway between the diameter of the outer thread ridges and the inner thread valleys. In this manner, the washer member 101 may be threaded onto the threaded stem portion 65b until it falls into, or is received within, the necked down portion 65c and is captively retained therein. This washer member 101, in turn, maintains the attachment member 100 captive relative to the ferrule 65. The ferrules 64 and 65, the pin member 95, the attachment member 100, the washer 101, the annular contact member 98 and the pressure fit cup-shaped member 69 are all formed of an electrically conductive material, such as brass. In addition, the exposed outer metallic surfaces of the components of the switch device 60 are anodized or coated with a thin layer (not shown) of a nonconductive material to provide electrical isolation from external devices, such as tools.

By reference to FIG. 7, the thus assembled components of the switch device 60 are shown in exploded relationship, just prior to final assembly. The housing portion has the diode 33 in place with the inner and outer sleeves 74 and 76 coupled together, with the leads 31 of diode 33 formed and fitted within the arcuate grooves 88 in the end faces 74a and 74b of inner sleeve 74. The attachment member 100 has the cup-shaped opening and tapered edge thereof in facing relation with one end of the housing on the side including annular groove 80 of sleeve member 74. Correspondingly, the ferrule 64 has the annular recess 68 in facing relation with the housing on the side including annular groove 79 of sleeve member 74.

Referring also to FIGS. 11 and 12, the threaded stem portion 64b of ferrule 64 is threadably received within the bore 77 of inner sleeve member 74. During this threading, the wall of inner sleeve 74 is positioning itself within the annular recess 68 of ferrule 64 until, after complete, and tight, threading, the following events occur. The axially outer end of tapered edge 68a overlies the groove 79 of inner sleeve member 74 and is in proximate relation to a tapered edge of the wall of outer sleeve member 76. The end surface 74a of inner sleeve 74 is bottomed against the seat of the recess 68 of ferrule 65, this action causing the urging of lead 31 within slot 88 into frictional electrical abutting contact with the seat of annular recess 68. The end face 66 of stem portion 64b of ferrule 64 is within the bore just past the mid-point thereof. Thereafter, the tapered edge 68a of ferrule 64 is deformed, such as by staking, into contact with the bottom of groove 79 of sleeve 74, thus holding ferrule 64 stationary and captive relative to the sleeve member 74. The staking is accomplished at several points about the circumference of the tapered edge 68a. Alternatively, the entire circumference of the distal end of the tapered edge may be compressed radially inwardly, such as by swaging, into the groove 79. During this staking, or swaging, with the softer material of sleeve 74, the body of the stem portion 64b acts as a backing against the application of pressure to the tapered edge 68a, thus enabling deformation of this edge into the groove 79. At this juncture, the inner sleeve member 74 is fixedly and captively attached to the ferrule 74 and cable portion 61 with the electrical contact made between lead 31 and the seat of annular recess 68. The lead 31 is thus in electrical circuit relation with the battery cable portion 61.

After the ferrule 65 assembled with components 95, 98, 100 and 101 assembled thereon as shown in FIG. 7, the threaded stem portion 65b is threaded into the bore 77 at the other end thereof until the surface of annular contact pad member 98 is in abutting or proximate relation to the surface or end 66 of ferrule 64. In this position, the distal end of the tapered tapered edge of outer sleeve member 76 and overlies the circumferential groove 80 of inner sleeve member 74. The tapered edge of member 100 is then staked or swaged radially inwardly until the edge is frictionally fitted within the groove 80, whereupon the attachment member 100 is held captive relative to the housing. The depth of the cup of the cup-shaped attachment member 100 is such that, during this swaging or staking, the other lead 31 of the diode 30 is urged into tight engagement with the adjacent face of washer member 101, thus resulting in frictional electrical contact with the washer member 101 and, thus in electrical circuit relation with the battery cable portion 62. The ferrule 65 is thus held captive relative to the other components, although rotatable relative thereto, and thus, the components are not separable during use.

By reference to FIGS. 11 and 12, the switch device 60 is shown in its assembled condition, in the electrically closed and opened positions, respectively. In construction, the ferrule 65 is permitted to rotate relative to the cable portion 62 and housing sleeve members 74, 76, that is, to permit threading and unthreading relative to the bore 77. This unthreading is permitted through a limited axial movement due to the constraint of the washer member 101. In FIG. 11, the parts are illustrated with the switch device 60 in the conductive or closed position, that is, with annular contact pad 98 in electrically contacting relation with end 66 of ferrule 64 to thus provide electrical continuity between the battery terminal and vehicle ground.

In FIG. 12, the components are shown in the electrically open position, that is, with separation between the annular contact pad 98 and the end 66 of ferrule 64. This position is effected by the user grasping the knurled portions 64a and 65a of ferrules 64 and 65 respectively, and rotating ferrule 65 counterclockwise. As thus configured, the contact pad formed of annular member 98 and the end of pin member 95 is axially displaceable within the bore 77 relative to the fixed first contact pad formed by end 66 of ferrule 64. This occurs as the ferrule 65 is unthreaded or threaded. During this rotation, the pin 95 retracts until the pad 98 is out of contact with the other pad formed by end 66 of ferrule 64. Further, additional mechanical separation is prevented and the parts cannot be mechanically detached from one another. When the pads are thus separated, the electrical circuit for this embodiment is the same as that shown in FIG. 6, with light-emitting diode 33 then energized to provide visual indication of the deactivation of the switch device 60. As in the preceding embodiment, a lubricating non-corrosive gel is inserted into the bore 77 during assembly, and likewise, the facing contact pad surfaces may be formed with a concavity on one or both faces.

In any event, by applying a hard coating of insulating material or by anodizing a hard insulating material on the exposed outer surfaces of the switch device 60, such as the outer surfaces of portions 64a and 65a and 100, an additional measure of safety is provided should these surfaces make contact in such a way that a circuit is bridged across the two ferrules 64 and 65 with the switch device 60 in its opened position. Should this unlikely event occur, in the absence of such insulation, should the two knurled portions 64a and 65a contact ground at the same time, the diode 33 would cease blinking, and it would thus appear that the switch device 60 was in the closed position.

Figure 13:
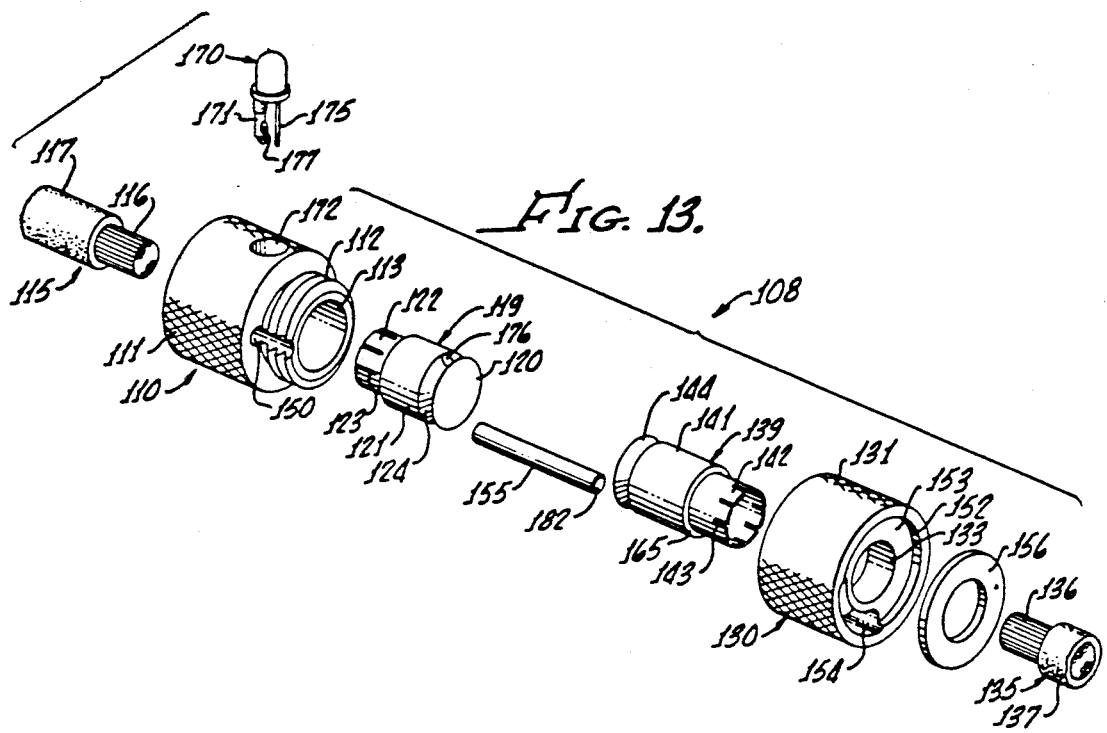
FIG. 13 is an exploded pictorial view of parts of a third embodiment of the switch of the present invention.
Figure 14:
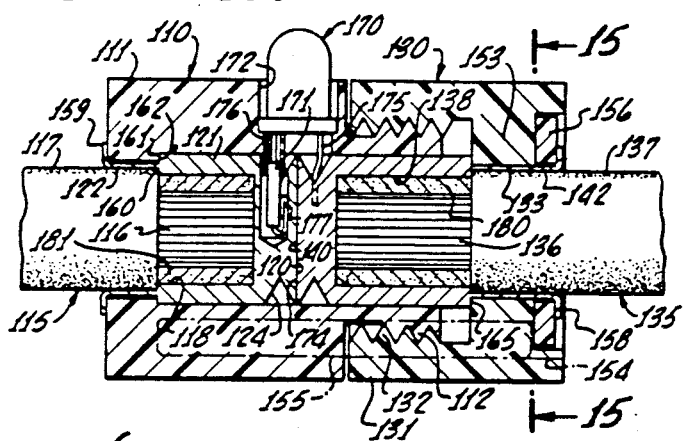
FIG. 14 is a longitudinal sectional view showing the switch in electrically closed condition.
Figure 15:
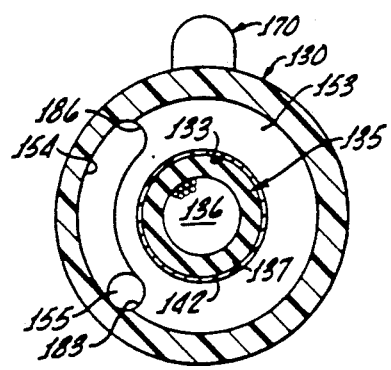
FIG. 15 is a section taken on line 15—15 of FIG. 14.
Figure 16:
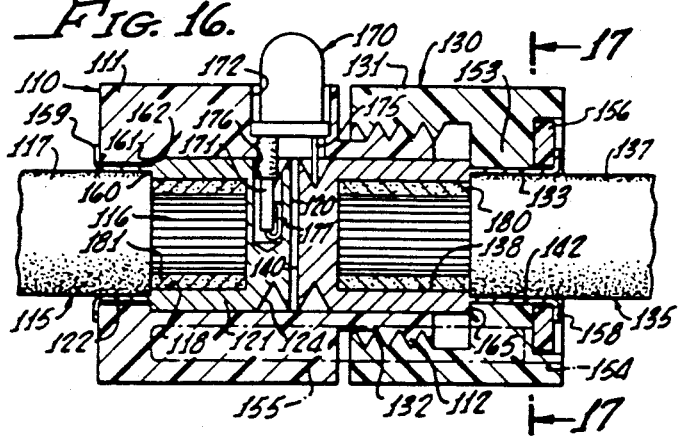
FIG. 16 is a longitudinal sectional view of the switch with the electrical connection between the cables broken.
Figure 17:
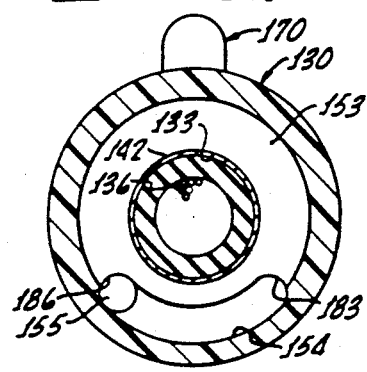
FIG. 17 is a section taken on lines 17—17 of FIG. 1.

A further and more simplified embodiment, presently preferred, is illustrated as switch 108 in FIGS. 13 through 17. As shown in FIG. 13, a first ferrule or connector 110, formed of an electrically nonconductive plastic material, has a relatively large diameter body 111 and an externally threaded smaller diameter front portion 112, with a bore 113 extending entirely through the connector. A first cable 115, has conductors 116 and outer insulation 117, having an end stripped to expose conductors 116. The first cable is inserted into and through the bore 113 from the rearward end (toward the left as viewed in FIG. 13) of the connector 110 to have the conductors 116 received in the bore 118 of an end cap 119, having a closed, flat front end 120. The end cap is formed of an electrically conductive and erosion resistant material, such as brass. End cap 119 has a cylindrical body 121 and a plurality of rearwardly extending thin, integral fingers 122, which are initially straight, as shown in FIG. 13, extending rearwardly therefrom. The fingers 122 are formed by a continuous integral thin, circumferentially extending wall extension having a plurality of circumferentially spaced axially extending slots 123 that separate the rearward extension into a plurality of individual fingers for purposes to be described hereinafter. End cap bud 121 is formed with a continuous circumferential groove 124 that is v-shaped in cross section, as best seen in FIGS. 14 and 16. The end cap is received within bore 113 of connector 110.

A second nonconductive connector 130, having an enlarged outer body 131, has its forward end (to the left as viewed in FIG. 3), provided with internal threads 132. A bore 133 axially extends through the connector 130 and has a diameter less than the diameter of the internally threaded forward portion 132. A second cable 135 has a plurality of conductors 136 encased in an insulation sleeve 137 and is arranged to have its stripped end inserted through the rearward end (toward the right as viewed in FIG. 13) of connector or ferrule 130 into the bore 138 of an electrically conductive end cap 139, having a planar end face 140 and a tubular body 141. End cap 139 is received within the bore 113 and extends beyond (to the left as viewed in FIGS. 14,16) the end of connector 130. Just as described in connection with end cap 119, end cap 139 has a rearwardly extending thin walled integral member forming a plurality of fingers 142 that are separated from one another by axially extending slots 143.

End cap 139 is formed at its forward end with a continuous circumferential groove 144 that is v-shaped in cross section, as can be seen in FIGS. 14 and 16.

Connector 110 is formed with an axially extending blind aperture 150 extending partly into body 11 and extending axially along the threaded portion 112, but forming only an open sided groove in the threaded portion because the axis of the aperture 150 extends at a radial distance between the root and peak of the external threads 112.

Connector 130 has its rear end recessed, as at 152 (FIG. 13), to form a circumferentially extending inner wall 153 at the inner end of such recess. Formed in and extending through wall 153 is a circumferentially extending slot 154 which may extend for a distance of from 90° to less than 360° around the circumference cf wall 153. In a presently preferred embodiment, the slot 154 extends 90°. A pin 155 is received in the longitudinal aperture 150 of connector 110 and has a free end extending into the slot 154 of connector 130, thereby limiting relative axial rotation to the circumferential length of the slot. To hold the pin in place, an electrically nonconductive washer 156 is mounted in the recess 152 and pressed against the inner wall 153 by ends 158 of fingers 142, which are bent over to extend radially outwardly and pressed securely and firmly against the outer side of the washer. Similarly, ends 159 (FIGS. 14,16) of fingers 122 of end cap 119 are bent over to extend radially outwardly and pressed firmly against the outer end of body 111 of connector 110 to firmly secure the end cap 119 to the connector 110.

End cap 119 is formed with a rearwardly facing (to the left as illustrated in FIGS. 14 and 16) shoulder 160, against which the edge of insulation 117 is pressed, and has a second shoulder 161, extending radially outwardly but rearwardly facing, against which a slightly inwardly projecting edge 162 of connector 110 is pressed. Thus the end cap 119 is locked to the connector 110 by fingers 159 and edge 162 of the end cap.

End cap 139 is locked to connector 130 by the capture of its wall 153 between the bent over fingers 158 of end cap 139 and a rearwardly facing shoulder 165 formed on the end of body 141 of end cap 139.

A light-emitting diode 170, having built-in blinking circuitry, includes a resistor 171 of a suitable resistance, such as three kilohms for example, and is inserted snugly into a radially extending aperture 172 extending through the wall of connector 110. The two end caps are so proportioned with respect to the relative lengths and thread positions of the two connectors that when the connectors are threadedly interconnected in the position illustrated in FIG. 14, the end caps contact one another at a contact junction plane 174, which is positioned substantially on the center line of aperture 172. Thus the one lead 175 of the diode, when the latter is positioned in the aperture 172, extends down to the bottom of groove 144 of end cap 139 and is bent to some extent as it presses against the bottom of the groove. End cap 119 is formed with a radially extending blind hole 176 into which the resistor 171, affixed to one of the diode leads, is inserted, with an end lead 177 of the free end of the resistor being doubled over and pressed against the wall of the aperture 176. As previously mentioned, the two connectors and the washer are formed of a suitable strong, erosion resistant and electrically nonconductive material, while the two end caps are formed, preferably integrally, of an erosion resistance electrically conductive material such as brass.

To assemble the switch, cable 115 is inserted through the rearward end of bore 113 of connector 110 into the bore of end cap 119, which itself is inserted into the bore 113 of the connector 110 from the forward end of connector 110. Preferably, the conductors 116 are soldered to the brass end cap 119, the solder being indicated at 181 in FIG. 14. With the parts seated in the relation illustrated in 14 the cable 115, now soldered to the end cap, may be pulled rearwardly to force the shoulder 161 of the end cap against the shoulder 162 of the connector, whereupon the fingers 122 are bent over, as indicated at 159, to securely lock the subassembly of connector 110, end cap 119 and cable 155 together.

In a similar manner, a subassembly of connector 130, end cap 139 and cable 135 is formed. The cable is inserted into the bore of the connector 130 from the rear, and the end cap 139 is inserted from the forward end of the connector to cause the conductors 136 of the cable to extend to the bottom of the bore of the end cap, where they are soldered in place, this solder being indicated at 180 in FIGS. 14 and 16. Connector 130 is then threaded upon connector 110 until the end faces 120 and 140 are almost in contact and aperture 150 of connector 110 is aligned with a portion of slot 154 in connector 130. Pin 155 is inserted through the connector 130, through the slot 154 therein, and then into the hole 150 of connector 110. Washer 156 is then inserted over the rearwardly projecting fingers 142 to seat in the recess 152 against wall 153. With the pin fully inserted, its free end 182 just barely clears the inner surface of washer 156, as can be seen in the dotted line showing of pin 155 in FIGS. 14 and 16. Again, the cable is pulled against the connector to force the end cap shoulder 165 against the wall 153 of the connector, and the fingers 142 are bent over, as indicated at 158, to firmly lock this subassembly of connector 130, end cap 139 and cable 135 together, with the washer 156 interposed between the bent over fingers and the wall 153 of the connector.

It will be noted that the slot 154 is positioned with respect to the aperture 150 and pin 155 so that when the connector 130 is turned all the way down upon the connector 110 to tightly force the two connectors against each other, the counterclockwise end 183 of the slot is aligned with the pin 155. Therefore the pin is received in the counterclockwise end 183 of the slot when the parts are in the closed positioned illustrated in FIG. 14. End cap 139 is made to an outer dimension with respect to the dimensions of the bore of connector 130 so that the connector 130 may rotate relative to the end cap. This enables the two connectors to be assembled to each other without excessive twisting of the cable 135 should it be already connected to a battery.

In connecting the two subassemblies of connector, cable and end caps (but before the pin 155 and washer are assembled) completed, the two subassemblies are brought into axial alignment, and the connectors threadedly engaged with one another. The connectors are relatively rotated to readily draw the two together until they reach, or almost reach, the closed position of FIG. 14. In this closed position the connectors are a tight frictional fit upon each other, and the end caps are in firm, full-face physical and electrical contact at junction plane 174. As previously indicated, connector 130 is rotatable relative to the end cap 139, but the latter is axially fixed to the connector so as to move axially with the connector 130, by abutment of wall 153 of connector 130 with shoulder 165 of end cap 139. When the two connectors have effectively "bottomed out", and are firmly pressed against one another by the threaded relative rotation thereof, the pin 155 is inserted through the slot 154 into the aperture 150. As mentioned above, the pin 155 may be inserted just before the end caps contact each other, as long as part of slot 154 is aligned with aperture 150. Washer 156, as previously mentioned, is then placed in the recess 152, and the ends of fingers 142 are bent over, as indicated at 158.

With the two connectors threadedly interlocked in the closed position, and the fingers 142 bent over, end cap 139 and cable 137 are firmly locked to each other and to the connector 130 with respect to axial motion, although limited relative rotation is still possible.

Radially extending aperture 172 in connector 110 is positioned in alignment with end cap junction plane 174 as previously indicated, and thus the diode 170 may now be inserted into the hole 172, being either a press fit or held in place by a suitable cement, such as epoxy or the like. Lead 175 and the resistor 171 of the diode are connected as previously indicated. Now the ends of the cables remote from the switch (which ends are not illustrated in FIGS. 13 through 17) may be connected to a battery and ground or other portion of the load as desired.

In closed position the end faces of the end caps are firmly pressed against one another to provide a large area electrical contact, whereby the two cables are electrically and physically connected to each other. An electrical current may flow through the cable across the junction 174, thereby shunting the diode 170, which accordingly does not emit any light. The closed position of the switch is illustrated in FIG. 14, with the cables interconnected in a normal mode of operation to flow current from one to the other. The two cables, however, may be disconnected, moved to an electrically open position, wherein the end caps are physically spaced from one another so that the cables are electrically disconnected. However, in such open position, which is illustrated in FIG. 16, the connectors are still threadedly engaged with one another, and thus firmly interconnected. To move from the closed position of FIG. 14 to the switch open position of FIG. 16, connector 130 is rotated relative to connector 110 in a counterclockwise direction, thereby moving an end 186 of slot 154 in a counterclockwise direction toward pin 155, which is initially positioned in the counterclockwise end 183 of the slot. When the end 186 of the slot encounters pin 155, further relative rotation of the connector parts is prevented, and thus, because the connectors have been rotated from their locked or closed position only through a fraction of a turn, the two are still firmly mechanically connected to each other. Moreover, the two cannot be disconnected. Accordingly, the cables cannot be mechanically disconnected (even though they are electrically disconnected) without substantially destroying the switch.

When the cables are electrically disconnected from one another, as in the open position of FIG. 16, the light-emitting diode 170 is no longer shunted by the interconnected cables, and thus is energized through its current limiting series connected resistor 171 by current drawn from the storage battery to which the cables are connected. With the diode thus in circuit with the battery and no longer shunted, it begins to blink so as to visually signal the fact that the cables are disconnected.

It will be seen that in each of the embodiments described above the two cables are axially separable by a small amount to electrically disconnect them, but that various means, such as a pin-and-slot in the embodiments of FIGS. 1 through 5 and FIGS. 13 through 17, are employed to limit the relative axial motion and prevent mechanical disconnection of the parts. In the embodiment of FIGS. 7 through 12 the limited axial motion of the two ferrules relative to one another is provided by the washer 101 riding in the slot 65c, the latter having a length greater than the thickness of the washer so that in effect, as the switch assembly of FIGS. 7 through 12 moves from the closed position of FIG. 11 to the open position of FIG. 12, the inner edge 101a of the washer rides along the length of the slot 65c from the right-hand end of the slot (as shown in FIG. 11) to the left-hand end of the slot (as shown in FIG. 12).

In the case of each of the above described embodiments, further axial motion beyond the electrically disconnected position is prevented so as to prevent complete mechanical disconnection of the two connectors. Moreover, axial separation is limited to a position in which there is a strong, firm mechanical interconnection between the parts. In the embodiments of FIGS. 1 through 5 and 13 through 17 further axial motion beyond the second electrically disconnected position is limited by a pin-and-slot arrangement which limits relative rotation of the threaded parts. In the embodiment of FIGS. 7 through 12 the limited axial motion is provided by the interengagement of the washer 100 and slot 65c.

Each of the alternate embodiments described above comprise a battery cable assembly including a compact, captive nonseparable in-line switch device 20, 60 or 108, with indicator means for providing visual indication of the disconnected state of the switch. The same threads provide for threaded mechanical assembly and electrical switch action of connecting and disconnecting the electrical contact pads, but are so modified that the two cable parts will remain firmly physically connected, and cannot be physically disconnected, even when the switch is in its open position.

Illustrated in FIGS. 18 through 22 is still another embodiment of the invention. In this embodiment no physical separation of the two cables or conductors occurs when the switch is opened, and the two are fixedly interconnected mechanically in substantially the same manner at all times. However, an interposed rotary switch member in this embodiment is operable between switch open and closed position to either block flow of current from one cable to the other or to conduct flow of current between the cables through the rotary switch member.

As shown in FIGS. 18 through 22, a switch housing 200 made of an injection molded nonconductive plastic has a generally rectangular, somewhat elongated external configuration. The housing is formed with a circular aperture 203,204 respectively formed in the respective ends 201,202. Extending transversely through the housing from top 206 to bottom 207, and intersecting apertures 203,240 is a right circular cylindrical opening 210 that defines a switching chamber within the housing. Also formed in the upper surface 206, extending for substantially 90° around the periphery of opening 210, is an arcuate slot 211, provided for purposes to be described below.

A first battery cable or conductor 212, adapted to be connected to a vehicle ground or chassis, has fixedly connected thereto, both mechanically and electrically, a plastic, nonconductive end cap 213. Cap 213 has an end face 214 formed as a section of a right circular cylinder, being circularly concave and aligned with a portion of the outer wall or boundary of the cylindrical switching chamber 210, as best seen in FIGS. 20 and 22. End cap 213 is inserted into the switch housing through the opening 203 until its cylindrical curved surface 214 is aligned with the boundary of the cylindrical switching chamber. A circular end closure 216 is apertured to receive the cable 212, including an auxiliary cable 217 that is also electrically connected to the end cap 213.

End closure 216 includes a relatively enlarged head 218 and a necked down inner portion 219 that is received within the aperture 203. The end closure is fixedly secured in place, with head 218 abutting housing end 201, as by a nonconductive epoxy or the like.

Interposed between the end cap 213, which is made of copper, brass or other suitably noncorrosive electrically conductive material, is a wave washer 221, which is compressed between the end cap 213 and end closure 216 to continually urge the end cap inwardly of the housing and switch chamber.

The other end of the switch is identical to the first end, except for the omission of the auxiliary cable 217, and includes a second cable or conductor 230 to which is fixedly secured, both mechanically and electrically, a second nonconductive end cap 231, having a cylindrically arcuate inner face 232, which is coextensive with a portion of the boundary surface of the right circular cylindrical switching chamber 210, when the end cap 231 is assembled to the housing, as can be seen best in FIGS. 20 and 22. A second end closure 233 includes an enlarged head 234 and a necked down inner portion 235 that is received within the aperture 204 of the end of the housing. End closure 233 is fixed in place to the housing 200 by means of a suitable nonconductive epoxy, and, just as at the other end, a wave washer 238 is interposed and compressed between the inner portion of end closure 233 and the end cap 232.

A rotary contact member 240 has a generally right circular cylindrical configuration with a slightly enlarged end defining a peripheral flange 241. The rotary contact member is made of two substantially identical and mutually parallel electrically conductive cylindrical segments 242,243, which run substantially longitudinally of the rotary member, parallel to its longitudinal axis, and are spaced radially from each other on opposite sides of a longitudinal plane extending through the rotary switch member and containing its longitudinal axis. Mounted within the space between the cylindrical segments 242 and 243, interposed between these segments, is a nonconductive or electrically insulating plate 244 that has flat parallel opposite sides in close face-to-face contact with the flat parallel facing sides of the cylindrical segments 242,243. The interposed insulator 244 is fixedly connected to the cylindrical segments 242,243 by a suitable adhesive, such as a nonconductive epoxy or the like. Cylindrical segments 242,243 are preferably formed of a corrosion resistant, electrically conductive material, such as copper or brass.

A pair of angled slots 248,249 are formed in the upper end (as viewed in FIG. 18) of the rotary contact member 240, extending oppositely from an area at the top center of the cylindrical contact. The slots extend from opposite sides of insulator plate 244 downwardly and outwardly at an angle of substantially 45°.

The rotary contact member is rotatably positioned within the cylindrical switch chamber 210, being interposed between the end caps 213,231 which are urged against opposite sides of the rotary member 240 by the springs 221,238. Flange 241 at the lower end of the rotary contact seats upon a shoulder 251 formed by an enlarged lower portion 252 of the rotary switch chamber 210. An insulative nonconductive closure disc 254 is epoxyed in place in the enlarged aperture 252 to hold the rotary contact member in place against axial motion while allowing rotary motion of the rotary contact member within the switching chamber. The disc 254 also provides an external insulative cover for the end of the rotary contact member.

A light emitting diode 255, having leads 256,257, and including a resistor 258 secured to lead 256, is mounted to the top of the rotary contact member 242 and has its leads and resistor received within respective ones of the inclined slots 248,249. Preferably the leads are epoxyed in place within the slots 248,249 by means of a suitable electrically conductive adhesive.

The length of the rotary contact member 240 is such that the upper end thereof extends outwardly of and beyond the top 206 of the housing when the rotary contact member is positioned as shown in FIGS. 19 and 21. Fixedly mounted on the upper end of the rotary contact member is a handle 260 having an upper portion formed with an aperture 261 that snugly receives diode 255. The handle includes an enlarged bore 2623 that receives the upper portion of the rotary contact member 240. Handle 260 may be fixedly and non-rotatably secured to the rotary contact member by any suitable means. Illustrated for this purpose is a plastic, nonconductive pin 264 extending through a suitable aperture 265 (FIG. 18) in the handle and being received in a transversely extending groove 266 extending through an outer portion of the rotary contact member in a direction substantially parallel to a diameter of the contact member. Thus the plastic pin will lock the handle to the rotary contact member, preventing relative rotation of these two parts. It is also contemplated that the handle may simply be secured to the rotary contact member by a suitable adhesive, such as epoxy, in addition to or instead of the illustrated plastic pin and groove.

Diodes with built-in blinking circuits are most readily available with least cost as unidirectional devices and such unidirectional diodes must be connected with a predetermined polarity. Accordingly, a pin 268 is received in an aperture 269 in handle 260 and has an end received in the arcuate slot 211 of housing 200. Thus the 90° slot 211 cooperates with pin 268 to limit motion of the handle 260 and therefore motion of the rotary contact member 240 to 90°, that is, to the switch open and switch closed positions shown in FIGS. 19 and 21, respectively. Pin 268 and slot 211, by preventing 180° rotation of the rotary witch member, prevent the diode from being connected in the circuit with the wrong polarity.

FIGS. 19 and 20 show the switch in closed position. In this position the longitudinal extent of the handle is aligned with the longitudinal extent of the switch body and with the cables. In switch closed position electrical current will flow from one of the cables to the other and will flow between conductor 231 and conductor 213. As can be best seen in FIG. 20, in switch closed position, both of the conductive cylindrical segments 242 and 243 of the rotary switch member ar in firm electrical contact with both of the end caps 213 and 231. Accordingly, current will flow between the two end caps through both of the electrically conductive cylindrical segments 242,243. In this position, the rotation limiting pin 268 is in the clockwise end 270 (FIG. 18) of the arcuate slot 211.

To electrically disconnect the battery which is connected to cable 230) from the electrical system, and more specifically from the vehicle ground or chassis, switch handle 260 is moved in a counterclockwise direction, in the direction of arrow 272 of FIG. 20, until the handle reaches the position shown in dotted lines in FIG. 22. This is the switch open position, which is also shown in FIG. 21. In switch open position, the rotary contact member has been rotated 90° from its closed position, and each of the electrically conductive cylindrical segments 242,243 is now in contact with one of the end caps 213,231, but not with the other. Electrically conductive cylindrical segment 242 is in electrical contact with 213, but is insulated from end cap 231 by the interposed insulating plate 244. Similarly, cylindrical segment 243 is in electrical contact, in open position of the switch, with end cap 231, but is not in contact with and is insulated from end cap 213 by the interposed insulating plate 244.

In the switch closed position of FIGS. 19 and 20 the cylindrical segments 242,243, are both at the same potential so that the diode, which is always connected to and rotates with segments 242,243, is not energized. On the other hand, in the switch open position of FIGS. 21 and 22, the cylindrical segments 242,243 connect the diode in series circuit with the end caps 213,231, which accordingly energize the diode and cause it to blink. The blinking of the diode, as previously described in connection with the earlier described embodiments, indicates that the switch is in open position with the electrical system electrically disconnected from the battery.

In assembly of the described switch, the two end caps 213,231 are fixedly secured (as by solder, for example) to the respective cable ends after positioning the washers and end closures over the cables, as shown in FIG. 18. The rotary contact member is formed as a unitary right circular cylindrical contact with its two cylindrical segments and interposed insulator epoxyed together to provide a smooth continuous external cylindrical surface. The diode is then positioned on the upper end of the rotary contact member, and its leads soldered in the respective slots by means of electrically conductive epoxy. The assembly of diode and rotary contact member is then inserted from the bottom of the housing through the rotary switch chamber until the flange 241 seats on shoulder 251, whereupon the cover disc 254 is positioned and epoxyed in place.

After insertion of the rotary contact member into the switch chamber through the housing body, handle 260 is inserted over the top of the rotary contact member with the diode 255 extending outwardly through the handle opening 261, and the handle is secured to the upper portion of the rotary contact member either by insertion of the plastic pin 264 or by a nonconductive epoxy, as previously described. Rotation limiting pin 268 is then inserted through aperture 269 to be received in slot 211. It will be readily appreciated that if the indicator lamp 255 is not a unidirectional device, the pin 268 and motion limiting slot 211 may be omitted so that the rotary switch member may rotate through a full 360°. After assembly of the rotary switch member, the end caps are inserted and the assembly, including end closures compressed to compress the spring washers 221,238, while the closures 216,233 are adhesively secured in place.

If deemed necessary or desirable, suitable latching means, such as, for example, a depression (not shown) is provided on the upper surface of housing top 206 and configured and arranged to receive a protruding semicircular projection (not shown) extending downwardly from the bottom of the handle. This or an equivalent arrangement will temporarily latch the handle in switch open or switch closed or both positions. Obviously other temporary latching means may be employed as deemed necessary or desirable to provide an audible and tactile indication of the switching position and to prevent inadvertent displacement of the switch from either one of its selected positions.

A significant advantage of the arrangements described in FIGS. 18 through 22 is the fact that the diode may be completely assembled to the rotary contact member 240 before the latter is assembled to the housing, so that soldering or epoxying of the diode leads 256,257 to the slots 248,249 may be carried out before the rotary contact member is positioned in the housing. With this arrangement a proper, effective and permanent electrical interconnection of the diode leads to their energizing circuit elements is assured.

It will be readily appreciated that other means of mounting and connecting the diode to the upper end of the rotary contact member may be provided. For example, upper portions of the cylindrical segments 242,243 may be cut back or otherwise configured, other than with the illustrated slots, to provide surface configurations of the cylindrical segments 242,243 to which the diode leads may be suitably affixed.

Although the illustrated configuration, wherein the diode and handle are connected to the same end of the rotary contact member is presently preferred, it will be readily appreciated that the diode may be connected to one end of the rotary contact member with the handle connected to the other. In such a case the rotary contact member would extend outwardly of the housing beyond that side of the housing opposite the side to which the diode is mounted.

Further, although the housing illustrated and presently preferred has two separate fixedly attached nonconductive end closures, it is contemplated that one of these end closures be made integral with the housing so that the housing, when manufactured, would be closed at one end. This end of the housing would be suitably configured to receive the cable having the end caps secured thereto by inserting the cable first through the opposite end of the housing and then through the hole formed in the fixed integrally closed housing end that receives the cable. In other words, in such a configuration one end closure, such as end closure 233 for example, could be formed integrally with the housing 200 and the cable 230 with end cap 231 affixed and with the spring 238 thereon would be inserted into the housing first through the opposite end opening 203 and then through the opening 204 formed in the fixed integral housing end.

As mentioned above, when the second end closure, such as end closure 216 for example, is fixed to the body 200, the two end closures are pressed toward each other by a suitable tool so as to compress both of the interposed spring washers 221,238. These washers, being held in place by the end closure, continually urge the end caps 213,231 toward each other, and therefore urge these against the cylindrical exterior surface of the rotary contact member. The rotary motion of the latter, when rotated by operating handle 260, provides a wiping action which maintains relatively clean contact surfaces.

The several embodiments of the switches described herein have been specifically illustrated as being connected to short cable lengths themselves or have opposite ends thereof remote from the switch connected respectively to a storage battery terminal and to a system ground, such as a vehicle chassis. It is also contemplated that one of the cable sections, such as cable 230 of the embodiment of FIGS. 18 through 22 for example, be eliminated and replaced by a connector construction (not shown) that directly connects end cap 231 to a battery terminal. A battery cable is generally formed with a terminal connector which is fixed to an end of the cable and is arranged to be inserted over the generally cylindrical, slightly tapered battery terminal and to be locked in place thereon by means of a clamp or lock nut arrangement. Such a terminal connector, in an alternate arrangement (not shown), would be directly connected to one of the end caps, such as end cap 231 for example, with only a very short section of interposed cable 230, or with no interposed cable section at all. Thus the entire switch assembly would be positioned immediately adjacent the storage battery terminal, where it would be more readily accessible and its signal light 255 would be more readily visible.

While there have been shown and described preferred embodiments, it is to be understood that various other adaptations and modifications may be made within the spirit and scope of the invention.

What is claimed is:

1. A battery cable assembly for connection to a terminal of a storage battery in circuit relation with an electrical system, said assembly comprising:
   a battery cable conductor means formed of first and second battery cable portions;
   first and second conductive contact pads, one being electrically connected to each of first ends of said first and second battery cable portions;
   housing means including bore means with thread means
   within said bore means, said housing means being at least partially electrically nonconductive;
   first and second ferrule means;
   means on said first ferrule means for coactingly engaging said first cable portion and the thread means of said bore means for maintaining said first pad in axial alignment within said bore means;
   means on said second ferrule means for coactingly engaging said second cable portion and the thread means of said bore means for maintaining said second pad in axial alignment within said bore means;
   coacting means on said housing means and at least one of said ferrule means for enabling limited rotational nonseparating movement of said at least one ferrule means relative to said housing means for providing relative axial displacement between said pads for enabling selective energization and deenergization of the electrical system,
   said coacting means on said at least one ferrule means and said housing means including a first axially extending pin member on said housing means and a second axially extending pin member on said at least one ferrule means, said first and second pin members being positioned for contacting relation to limit the rotation of the at least one ferrule means for precluding separation of said at least one ferrule means from said housing means.

2. The assembly according to claim 1 wherein said housing means further includes first and second conductive end cap means on opposing sides of the bore means of said housing means, each of said end cap means being in electrically conducting relation with one of said battery cable portions, and means electrically connected across said end cap means for providing a visual indication of the separation of said pads.

3. The assembly according to claim 2 wherein said at least one ferrule means includes means for manually gripping for enabling rotation thereof.

4. The assembly according to claim 2 wherein said at least one ferrule means is rotatable relative to said bore means and the other of said ferrule means is fixed relative to said bore means.

5. The assembly according to claim 4 wherein said housing means includes a sleeve member formed of insulating material with said bore means formed therein, and wherein said end cap means are secured to opposite ends of said sleeve member.

6. The assembly according to claim 5 wherein said visual indication means includes a blinking light-emitting device for energization via the storage battery and an electrical circuit through the light emitting device to provide such visual indication.

7. A switch for a storage battery comprising:
first and second cables,
first and second conductive end caps fixed to ends of said first and second cables respectively,
first and second threaded connectors coupled with said first and second end caps respectively, said connectors being threadedly interconnected and relatively rotatable between a first position in which the connectors press said end caps into abutting electrically conductive relation and a second position in which the end caps are axially spaced from one another by a relatively small distance, and
a pin fixed to one of said connectors and a slot in the other of said connectors receiving said pin, whereby said connectors and cables are securely mechanically connected to one another when said end caps are electrically disconnected.

8. A storage battery switch for providing selective electrical connection and disconnection of a battery to a load while preventing mechanical disconnection of the battery comprising:
first and second cables, configured relatively for connection to a load and to a storage battery each having first and second cable ends, respectively,
first and second connectors connected to respective ones of said cables,
means for interconnecting said connectors to one another for motion between a closed position in which said cable ends are electrically interconnected and said connectors are tightly affixed to one another, and a second position in which said cable ends are axially displaced from one another and electrically disconnected, said connectors being securely affixed to one another in said second position, and
an axially extending pin coupled with one of said connectors and a circumferentially extending slot from the other of said connectors, said pin having a portion thereof extending into said slot, whereby said cable ends may be electrically connected by motion of said connectors to said first position, and may be electrically disconnected by motion of said connectors of said second position, and whereby said cables and connectors cannot be physically detached from one another.

9. A battery cable switch for electrically connecting and disconnecting first and second electrical conductors while maintaining the conductors physically attached to one another, comprising:

first and second conductors having first and second electrically conductive caps respectively fixed thereto,
a housing interconnecting said first and second conductors and holding them mechanically connected to one another,
said caps being captured within said housing in mutually
spaced relation and having mutually facing concavely curved facing surfaces collectively defining at least part of a circularly curved switch chamber therebetween,
a contact member in said chamber interposed between the caps and having a curved contact surface configured to mate with the circularly curved switch chamber, said contact surface being in close sliding contact with both said caps, said contact member having first and second contact portions, said first contact portion being electrically conductive, and said second contact portion being electrically nonconductive, said contact member being rotatable in said switch chamber between a first position wherein said first contact portion is in electrical contact with said first cap and is insulated from said second cap, and a second position in which said first electrically conductive contact portion extends between said first and second caps and is in electrical contact with both of said first and second caps.

10. The cable switch of claim 9 including means for urging said caps toward each other and against said contact member.

11. The cable switch of claim 9 wherein said contact member includes a third electrically conductive contact portion, said second nonconductive contact portion being interposed between and insulating said first and third electrically conductive contact portions from one another, said third contact portion being in electrically conductive contact with said second cap in said first position and being in electrically conductive contact with both said first and second caps in said second position.

12. The cable switch of claim 11 including lamp means having first and second leads connected to said first and third contact portions respectively.

13. The cable switch of claim 9 including lamp means mounted to said housing, and means for connecting said lamp means to said contact member to be energized from said first and second conductors when said contact member is in said first position and to be de-energized when said contact member is in said second position 14. The cable switch of claim 9 wherein each of said concavely curved facing surfaces defines a portion of the surface of a right circular cylinder, and wherein said contact member has an exterior surface in the form of a right circular cylinder.

15. The battery cable switch defined in claim 9, wherein said switch is capable of being retrofitted into an existing battery cable by dividing the cable and thus creating said first and second conductors.

16. A battery cable switch for electrically connecting and disconnecting first and second electrical conductors while maintaining the conductors physically attached to one another and to the battery, comprising:
first and second conductors having first and second electrically conductive caps respectively fixed thereto, a housing interconnecting said first and second conductors and holding them mechanically connected to one another, said caps being captured within said housing in mutually spaced relation and having mutually facing concavely curved facing surfaces collectively defining at least part of a circularly curved switch chamber therebetween, and a rotary contact member mounted in said switch chamber for motion between a first position in which electrical current flow between said caps is blocked by said contact member and a second position in which electrical current flow between said caps is conducted by said contact member.

17. The switch of claim 16 wherein said rotary contact member is partly conductive and partly nonconductive.

18. The switch of claim 16 wherein said rotary contact member comprises first and second electrically conductive cylindrical segments longitudinally insulated from each other, each said segment, in said first position, being in contact with one of said caps and being insulated from the other, and both said segments, in said second position, being in contact with both said caps.

19. The switch of claim 18 including a nonconductive material interposed between and fixed to both said segments.

20. The switch of claim 19 including means for urging said caps toward one another and against said rotary contact member.

21. The switch of claim 16 including lamp means electrically coupled across said caps, and means in circuit with said rotary contact member for energizing said lamp means only when said contact member is in said first position for thereby providing a visual indication of blocked current flow.

22. The battery cable switch defined in claim 16, wherein said switch is capable of being retrofitted into an existing battery cable by dividing the cable and thus creating said first and second conductors.

23. A battery cable switch for connection to a terminal of a storage battery in circuit relation with an electrical system, to enable electrical connection and disconnection of said storage battery from said electrical system while maintaining physical connection between the battery and the electrical system, said battery cable switch comprising:

first and second battery conductors having first and second electrically conductive end caps respectively fixed thereto, an electrically nonconductive housing having a cylindrical switch chamber extending transversely therethrough, and having first and second conductor end cap receiving ends, said first conductive end cap being received in said first housing end, and said second conductive end cap being received in said second housing end, said end caps each having a circular surface forming a cylindrical boundary portion of said switch chamber and being mutually spaced from each other across said switch chamber, a first nonconductive housing closure fixed to said first housing end, a first spring interposed between said first closure and said first end cap and configured to urge said first end cap inwardly of said switch chamber, a second nonconductive housing closure fixed to said second housing end, a second spring interposed between said second end cap and said second end closure and configured to urge said second end cap inwardly of said switch chamber, a rotary contact member rotatably mounted in said switch chamber and having a circularly cylindrical outer surface in sliding contact with the circular cylindrical surfaces of said first and second end caps, said rotary contact member comprising first and second longitudinally extending electrically conductive cylindrical segments and an electrical insulator interposed between said segments and secured thereto, thereby insulating said cylindrical segments from each other, said rotary contact member being rotatable within said switch chamber between a switch open position in which each of said cylindrical segments is in electrical contact with one of said end caps and is insulated from the other, and a switch closed position in which each of said cylindrical segments is in electrical contact with both of said end caps, a lamp mounted to said housing, means in circuit relation with said cylindrical segments and end caps for energizing said lamp from the battery only when the rotary contact member is in said switch open position, thereby providing a visual indication of said switch open position, and a handle connected to said rotary contact member for rotating the rotary contact member between said positions.

24. The battery cable switch defined in claim 23, wherein said switch is capable of being retrofitted into an existing battery cable by dividing the cable and thus creating said first and second conductors.

* * * * *

UNITED STATES PATENT AND TRADEMARK OFFICE
CERTIFICATE OF CORRECTION

PATENT NO. : 5,066,905
DATED : November 19, 1991
INVENTOR(S) : Arnold L. Betton et al.

It is certified that error appears in the above-identified patent and that said Letters Patent is hereby corrected as shown below:

IN THE BACKGROUND OF THE INVENTION

In column 1, line 56, please delete "clam" and substitute therefor --clamp--.

IN THE BRIEF DESCRIPTION OF THE DRAWINGS

In column 3, line 31, before "circuit" please delete "s".

In column 9, line 15, before "sleeve" please delete "s".

In column 10, line 21, before "65" please delete "rule".

In column 12, line 12, please delete the second occurrence of "tapered"; and after "edge" please insert --of attachment 100 is in proximate relation to the tapered edge.--

In column 15, line 36, please delete "positioned" and substitute therefor --position--.

In column 19, line 17, please delete "2623" and substitute therefor --263--.

In column 19, line 45, please delete "witch" and substitute therefor --switch--.

UNITED STATES PATENT AND TRADEMARK OFFICE
CERTIFICATE OF CORRECTION

PATENT NO.    : 5,066,905
DATED         : November 19, 1991
INVENTOR(S)   : Arnold L. Betton et al.

It is certified that error appears in the above-identified patent and that said Letters Patent is hereby corrected as shown below:

In column 19, line 56, after "member" please delete "ar" and substitute therefor --are--.

In column 19, line 63, before "which" please insert --(--.

Column 23
In claim 8, line 26, after "connectors" please delete "of" and substitute therefor --to--.

Column 24
In claim 13, line 6, after "position" please insert --.--.

Column 25
In claim 23, line 18, before "surface" please insert --cylindrical--.

Signed and Sealed this

Twenty-second Day of June, 1993

Attest:

MICHAEL K. KIRK

Attesting Officer    Acting Commissioner of Patents and Trademarks